(12) United States Patent
Wichern

(10) Patent No.: US 6,762,655 B2
(45) Date of Patent: Jul. 13, 2004

(54) CIRCUIT ARRANGEMENT

(75) Inventor: Andreas Wichern, Hamburg (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/960,099

(22) Filed: Sep. 21, 2001

(65) Prior Publication Data

US 2002/0053955 A1 May 9, 2002

(30) Foreign Application Priority Data

Sep. 23, 2000 (DE) ......................................... 100 47 214

(51) Int. Cl.$^7$ ................................................. H03H 7/12
(52) U.S. Cl. ........................ 333/175; 333/177; 333/184
(58) Field of Search ................................. 333/175, 177, 333/181, 184, 185; 336/232, 200; 343/700 NS, 895; H03H 7/09

(56) References Cited

U.S. PATENT DOCUMENTS

| | | | | |
|---|---|---|---|---|
| 3,769,616 A | * | 10/1973 | Singh ...................... | 333/175 X |
| 4,518,965 A | * | 5/1985 | Hidaka ...................... | 343/742 |
| 5,281,932 A | * | 1/1994 | Even-Or ...................... | 333/32 |
| 5,431,987 A | | 7/1995 | Ikeda ........................ | 428/209 |
| 5,583,474 A | * | 12/1996 | Mizoguchi et al. ..... | 336/200 X |
| 5,594,342 A | * | 1/1997 | Brey et al. .................. | 324/322 |
| 5,629,553 A | * | 5/1997 | Ikeda et al. ................. | 257/531 |
| 5,646,633 A | * | 7/1997 | Dahlberg ............. | 343/700 MS |
| 5,697,087 A | * | 12/1997 | Miya et al. ................. | 455/307 |
| 6,157,727 A | * | 12/2000 | Rueda ......................... | 381/312 |
| 6,215,374 B1 | * | 4/2001 | Petrovic ...................... | 333/177 |
| 6,317,101 B1 | * | 11/2001 | Dockery ..................... | 343/895 |

* cited by examiner

Primary Examiner—Robert Pascal
Assistant Examiner—Dean Takaoka
(74) Attorney, Agent, or Firm—Aaron Waxler

(57) ABSTRACT

To provide a circuit arrangement for filtering and/or selecting single frequencies or frequency ranges, particularly of signals intended for at least an integrated circuit and/or signals generated by at least an integrated circuit, said circuit arrangement (100) comprising at least two electric resonant circuits (10; 20; 30)

with at least an inductive element (12; 22; 32) and at least a capacitive element (14; 24; 34), which, at a given low power supply voltage, provides a dynamic range complying with the current requirements, on the one hand, and has a maximal quality factor (Q), on the other hand, and can be realized in an inherently symmetrical arrangement and combined with a differential or balanced circuit technique to be preferred in integrated techniques, it is proposed that the resonant circuits (10; 20; 30), particularly the inductive elements (12; 22; 32) are magnetically fixedly coupled to each other, and in that at least a part, preferably all resonant circuits (10; 20; 30) of the circuit arrangement (100) are arranged at or on the integrated circuit, particularly on only one metallization plate (40) of the integrated circuit, having an essentially constant ohmic resistance.

7 Claims, 6 Drawing Sheets

CIRCUIT ARRANGEMENT

TECHNICAL FIELD

The invention relates to a circuit arrangement for filtering and/or selecting single frequencies or frequency ranges, particularly of signals intended for at least an integrated circuit and/or signals generated by at least an integrated circuit, said circuit arrangement comprising at least two electric resonant circuits with at least an inductive element and at least a capacitive element.

BACKGROUND AND SUMMARY OF THE INVENTION

In this respect, it should be generally noted that, when receiving and/or generating high-frequency signals, it is necessary to select individual frequencies or frequency ranges from a total number of received and/or generated signals. This selection is usually performed by means of filters comprising inductive elements and capacitive elements. The basic element in the filter technology is the resonant circuit which, in its simplest form, comprises a coil (inductance L) whose losses are represented by means of a equivalent resistance $R_p$ parallel to the coil and a capacitor (capacitance C) arranged parallel to the coil. The dynamic range of such a resonant circuit oscillating at a resonance frequency $f_r=(2\pi)^{-1}\cdot(L\cdot C)^{-0.5}$ at a given power supply voltage and at a given drive (AC) current, normally decreases with an increasing quality factor Q (the so-called quality factor Q is a measure of the filter action and/or the selectivity of a circuit arrangement and increases linearly with the above-mentioned resistance $R_p$).

This reduction of the dynamic range is particularly a problem in modern methods of manufacturing integrated circuits, because such signal-receiving, signal-processing and/or signal-generating circuits must be able to receive, process and generate signals in the low voltage range so as to comply with the current technical requirements (note, for example, the multitude of electric and electronic apparatuses in the field of multimedia or also telecommunication).

It is therefore to be taken into account that the operating time of circuit arrangements implemented in electric and electronic apparatuses are subjected to increasingly stricter requirements, and certainly when portable apparatuses are concerned. The tendency, which in future may be even stronger, can be recognized that the operating voltage of integrated circuits (ICs) used in such apparatuses is increasingly further reduced, inter alia, also because of thermal grounds.

To achieve a stronger filter action, which is absolutely necessary in the present, very dense occupation of the frequency bands for suppressing interference, as well as it is used for often officially required elimination of unwanted side products when generating signals, the equivalent resistance $R_p$ forcibly increases due to the above-mentioned linear relationship between the quality factor Q and the equivalent resistance $R_p$ parallel to the coil (in so far as all further components of the circuit arrangement remain unchanged).

This increase of the equivalent resistance $R_p$ has, however, its practical limit in that the dynamic range of the circuit arrangement is significantly reduced at a given fixed drive (AC) current generated by an active circuit as well as at a given fixed operating voltage, because the alternating voltage produced by the drive (AC) current may naturally be only twice the operating voltage at a maximum; with an increasing equivalent resistance $R_p$ this voltage amplitude is already achieved at ever smaller alternating currents.

The result is that particularly but not exclusively in accumulator-powered mobile electric and electronic apparatuses in which the power supply voltages are smaller and smaller and simultaneously the requirements imposed on the dynamic range become increasingly stricter (for example, relating to the reception of weak unwanted signals in the presence of strong unwanted signals), the way of continuous increase of the equivalent resistance $R_p$ for increasing the quality factor Q is not the object but is rather a drawback; moreover, the value of the drive (AC) current is often fixed by the working point adjustment of the control transistor so as to achieve a given collector current noise minimum or to achieve the transition frequency required for processing the signals.

A possibility of increasing the quality factor Q of a circuit arrangement of the type described in the opening paragraph is the conventional method of adding further turns to the inductive element of the circuit because in this case the mutual counter inductance thus produced between the additional turns of the coil plays a role.

This addition of further turns to the inductive element of the circuit is, however, not promising in so far as can be mathematically proved (compare H. H. Meinke/F. W. Gundlach: Taschenbuch der Hochfrequenztechnik; Springer-Verlag Berlin Heidelberg, 3rd edition 1968, pp. 183 etc., 185 etc.) so that an increase of the quality factor Q by way of increasing the number of turns of the inductive element of the circuit results in a significantly overproportional increase of the equivalent resistance $R_p$ representing the losses of the circuit arrangement (for example, a double number of turns of the inductive element of the circuit is accompanied by an eight-fold increase of the equivalent resistance $R_p$ representing the losses of the circuit arrangement). It has already been mentioned above that such an increase of the equivalent resistance $R_p$ is a great drawback (apart from the fact that the capacitance of the parallel capacitive element would then only be one-fourth of the original capacitance of the capacitive element).

A circuit arrangement of the type described in the opening paragraph, in which at least a part of the above-mentioned difficulties has been taken into account, is known from U.S. Pat. No. 5,431,987. This document describes a noise filter with a first spiral electrode operating as an inductance on an insulator substrate and with a second spiral electrode also operating as an inductance via the first spiral electrode, while a dielectric layer is present between the two spiral electrodes. Due to their partial overlap, both inductances simultaneously operate as capacitors so that a capacitance is produced between the two spiral electrodes.

It is true that the known circuit arrangement provides an acceptable noise suppression in a signal transmission circuit, in a current supply circuit or the like, but the circuit arrangement disclosed in U.S. Pat. No. 5,431,987 has the drawback in so far that a satisfactory, i.e. "fixed" coupling of the two inductances (coupling factor k between the two inductances near its maximum value 1) cannot be realized in practice due to the different implementation of the second inductance as compared with the first inductance.

Moreover, in the circuit arrangement disclosed in U.S. Pat. No. 5,431,987, the quality factor Q, which in this case increases linearly with the root of the product of the inductance $L_1$ of the first inductive element and the inductance $L_2$ of the second inductive element (i.e. Q is directly proportional to $(L_1 \cdot L_2)^{0.5}$) suffers from the fact that the inductance $L_1$ of the first inductive element and the inductance $L_2$ of the second inductive element are different due to the different implementation and due to necessity of a planar layout so that the quality factor Q cannot reach its maximum value (as is known, $(L_1 \cdot L_2)^{0.5}$ only becomes maximal when $L_1 = L_2$).

Moreover, the known circuit arrangement has the problem that the two inductive elements are arranged on different and, consequently, differently ohmic metallization layers so that the losses are clearly increased and the quality factor Q is significantly reduced. Moreover, the known circuit arrangement cannot be realized in inherently symmetrical arrangements and, consequently, cannot be combined adequately with the differential or balanced circuit technique to be preferred in the integrated technique (to this end, the first inductive reactance and the second inductive reactance must be used pair-wise, which is not the case in U.S. Pat. No. 5,431,987).

It is an object of the invention to provide a circuit arrangement of the type described in the opening paragraph in which, at a given low power supply voltage, a dynamic range complying with the current requirements is possible, on the one hand, and has a maximal quality factor Q, on the other hand, while it should be possible to realize the circuit arrangement in inherently symmetrical arrangements as well as combine it with the differential or balanced circuit technique to be preferred in the integrated technique.

This object is achieved by the characteristic features defined in claim 1. Advantageous embodiments and essential further embodiments of the present invention are defined in the dependent claims.

In accordance with the teaching of the present invention, the fact that the resonant circuits and particularly the inductive elements are not DC coupled but (only) magnetically fixedly coupled to each other, a surprisingly wide dynamic range thereby becomes possible, on the one hand, while a high quality factor Q is obtained, on the other hand. This is due to the fact that an increase of the quality factor Q in the case of a purely magnetic coupling of the resonant circuits in no way involves an overproportional increase but only a directly proportional increase of the equivalent resistance $R_p$ representing the losses of the circuit arrangement. For example, a double quality factor Q is accompanied by a double equivalent resistance $R_p$ representing the losses of the circuit arrangement.

As regards the design and layout of the circuit arrangement according to the present invention, the facts based on this background essentially provide more possibilities than in conventional circuit arrangements. For example, it is advantageously possible to increase the arrangement of two resonant circuits with a magnetically fixed coupling (coupling factor k between the two inductive elements near its maximum value 1) to a larger number of resonant circuits and thus further raise the quality factor Q.

The fact that, in accordance with the teaching of the present invention, at least a part, preferably all resonant circuits of the circuit arrangement are arranged at or on the integrated circuit, particularly on only one metallization plate of the integrated circuit, having an essentially constant ohmic resistance, the two or more inductive elements are not arranged in different and, consequently, differently ohmic metallization plates. This is a significant advantage as compared with conventional circuit arrangements in so far that the circuit arrangement according to the present invention can always be implemented in the lowest ohmic, preferably upper metallization plate of the integrated circuit so that the resonant circuit losses occurring during operation of the circuit arrangement are clearly reduced and the quality factor Q is significantly increased which, inter alia, is also due to the fact that contacts, which are necessarily present in conventional circuit arrangements, with further higher ohmic metallization plates and resultant high additional losses are avoided in the present invention.

In this respect, those skilled in the art will particularly appreciate that the circuit arrangement according to the present invention can be realized in an inherently symmetrical arrangement and, consequently, combined also individually with the differential and balanced circuit technique to be preferred in the integrated technique. Another positive aspect of the circuit arrangement according to the invention is that a magnetically fixed coupling of the resonant circuits is realized which, as against the conventional circuit arrangements in the high-frequency technique, represents considerable progress in so far as these are conventionally coupled weakly (for example, the coupling degree in band-pass filters comprising two resonant circuits that are coupled together is often only in the range of a few percents).

If the present invention is to be further implemented in a very essential way, it is recommendable that at least two inductive elements each have one, and preferably more turns which are substantially concentric and/or parallel to each other. Such a winding can be realized, for example by arranging an inductive element in the form of a coil having at least one turn within a further coil also having at least one turn. An even higher degree of magnetic coupling can be achieved when the respective turns of at least two inductive elements are wound parallel to each other in a preferred form (in a sense comparable with a bifilar winding in which also two or more inductive elements are intertwined). In this way, a possibly fixed coupling and, hence, a maximal proximity of the inductive elements is achieved, which in turn results in a maximal magnetic coupling.

The invention also relates to an integrated circuit comprising at least a circuit arrangement of the type described hereinbefore.

Two embodiments of the invention will now be elucidated with reference to the drawing.

BRIEF DESCRIPTION OF THE DRAWING FIGURES

DETAILED DESCRIPTION

Figure 1:
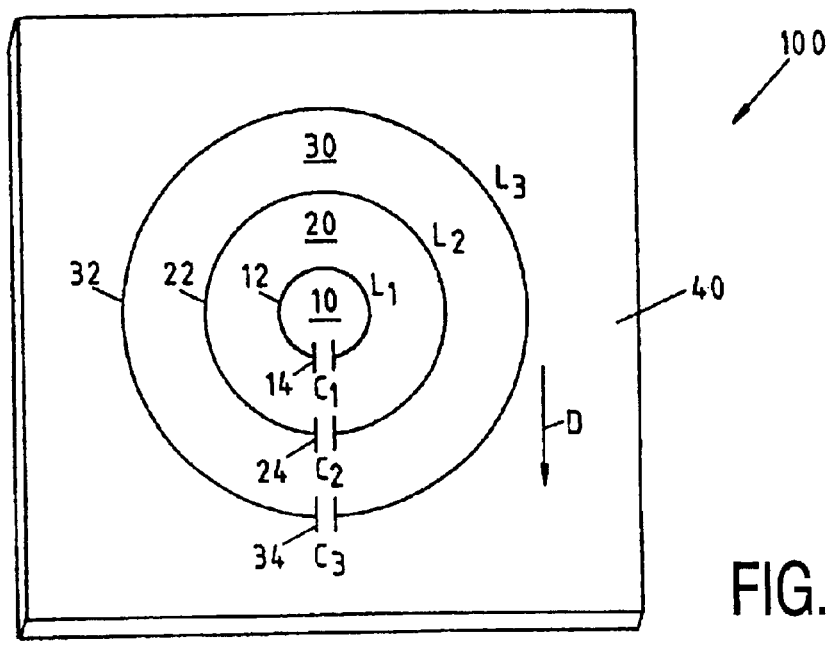
FIG. 1 shows a first embodiment of a circuit arrangement according to the present invention in a plan view.
Figure 2:
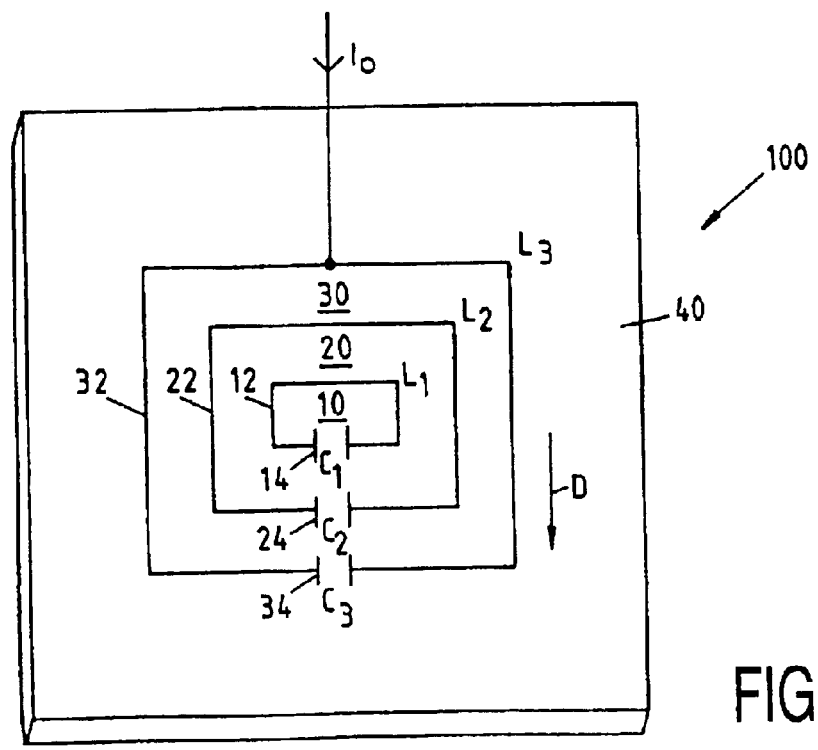
FIG. 2 is a second embodiment of a circuit arrangement according to the present invention in a plan view.

The circuit arrangement 100 is provided for filtering and selecting single frequencies or frequency ranges of signals which are intended for, or generated by an integrated circuit shown in FIGS. 1 and 2 and to be connected at the lower end (not shown for the sake of clarity in FIGS. 1 and 2).

In both embodiments, the circuit arrangement 100 comprises three electric resonant circuits 10, 20, 30, each of which is implemented with an inductive element 12, 22, 32 in the form of a single, essentially circular (cf. FIG. 1) or rectangular (cf. FIG. 2) turn and a capacitive element 14, 24, 34 in the form of a capacitor. The capacitive element 14, 24, 34 is arranged at the ends of each individual turn.

The capacitances $C_1$, $C_2$, $C_3$ of the capacitive elements 14, 24, 34 may be equally large, but this may not be the case because suitable selection of the capacitances $C_1$, $C_2$, $C_3$ of the capacitive elements 14, 24, 34 may adequately compensate, inter alia, the fact of the different sizes of the inductive elements 12, 22, 32 and the resultant different inductances $L_1$, $L_2$, $L_3$.

The special feature of the circuit arrangements 100 shown in FIGS. 1 and 2 is that the resonant circuits 10, 20, 30 and particularly the inductive elements 12, 22, 32 are not DC coupled together but (only) magnetically fixedly coupled together, which is to the advantage of both the dynamic range of the resonant circuits 10, 20, 30 and the quality factor Q of the circuit arrangement 100. This is even more remarkable in the sense that in conventional circuit arrangements (compare, for example, U.S. Pat. No. 5,431,987) an increase of the quality factor Q is at the expense of a decrease of the dynamic range.

In contrast, the dynamic range in the present invention, resulting from the purely magnetic coupling of the resonant circuits 10, 20, 30 is not affected by the increase of the quality factor Q. In this respect, it is also favorable that the capacitive elements 14, 24, 34 are arranged one after the other in essentially one direction D.

To realize the principle of on-chip filtering or on-chip selection in the embodiments shown in FIGS. 1 and 2, the resonant circuits 10, 20, 30 of the circuit arrangement 100 are arranged "on-chip" to a certain extent on the upper metallization plate 40 of the integrated circuit, having an essentially constant and explicitly low-ohmic resistance. To this end, the individual resonant circuits 10, 20, 30 are essentially arranged in a planar way on an outer surface area of the integrated circuit, in which the planar implementation is realized by the essentially concentric geometric structure (compare FIG. 1: circles; compare FIG. 2: rectangles) each time with one turn as an inductive element 12, 22, 32 and with one capacitor as a capacitive element 14, 24, 34.

This "on-chip" implementation of the circuit arrangement 100 by means of coils 12, 22, 32 integrated, for example, on a semiconductor crystal and capacitors 14, 24, 34 also saves external components and reduces the required surface area on the plate so that it simplifies the use of the integrated circuit (IC) also for users who do not have a very great technical experience.

This is particularly advantageous with a view to IC manufacturing processes in which no substrate is present any longer ("silicon-on-insulator" processes=SOI processes") or "silicon-on-anything" processes (SOA processes); compare the SPIRIT process by Philips) because the dielectric losses of the substrate then no longer affect the filter action or selectivity of the integrated resonant circuits becoming manifest by the quality factor. However, also other processes such as used in the QUBIC technology provide appropriate possibilities.

Via a "tap" in the center of the inductive element 32 shown in FIG. 2, i.e. in the virtual mass or symmetry point of the resonant circuit comprising inductive element 32 and capacitive element 34, the active integrated circuit connected to the circuit arrangement 100 via the ends of the inductive element 32 parallel to the capacitive element 34 (compare the lower parts in FIGS. 1 and 2; in the case of a central "tap" in accordance with FIG. 2, a differential circuit is concerned) may even receive a direct current $I_0$ for biasing purposes without a conductor crossing being necessary and without a connection to the center of the circuit arrangement 100 being absolutely required. A corresponding central "tap" can also be realized for the circuit arrangement 100 shown in FIG. 1.

The circuit arrangement 100 shown in FIGS. 1 and 2 may be used principally for any signal generating and/or signal processing integrated circuit in the case of selective signal reception and/or selective signal supply and has the great advantage that it has an extremely small construction and thus substantially contributes to realizing the object of miniaturizing electric and electronic components.

The circuit arrangement 100 of FIGS. 1 and 2 can be particularly realized in a combination with a multitude of feasible integrated circuit families (for example, on the basis of GaAs=galliumarsenide; MOS=metal oxide semiconductor; Si=silicon; . . . ). Applications are feasible for any circuit structure in which filtering and/or selection by means of resonant circuits plays a role such as in, for example, a low-noise amplifier, a mixer, a voltage-controlled oscillator (with capacity diodes) but can also be technically realized without any problem as individual components in a filter.

Figure 3:
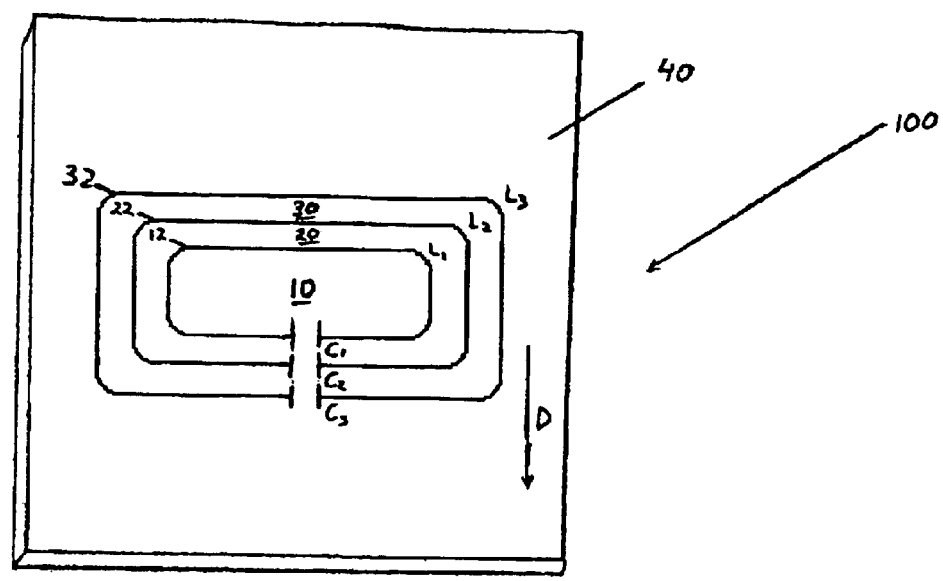
FIG. 3 shows an embodiment of a circuit arrangement according to the present invention having inductive elements in an oval turn in a plan view.
Figure 4:
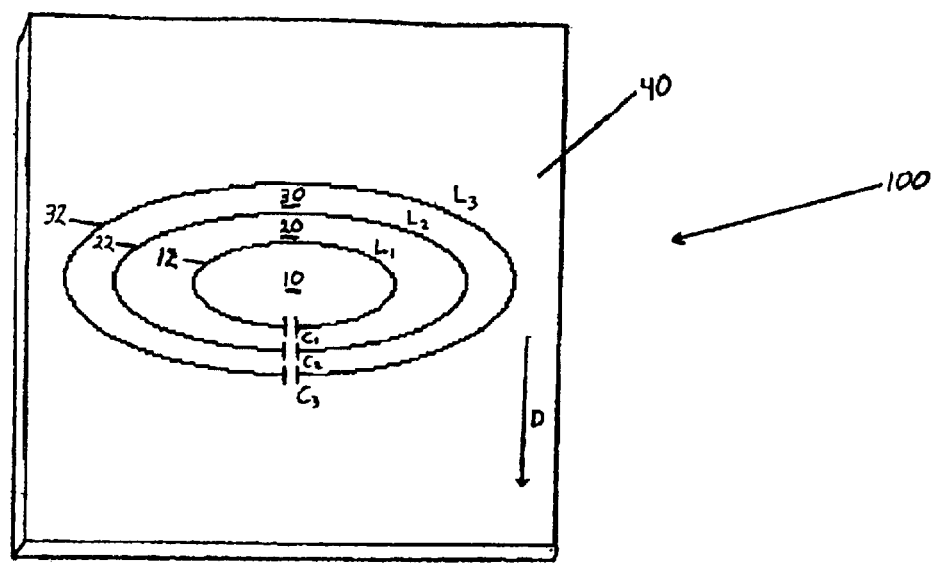
FIG. 4 shows an embodiment of a circuit arrangement according to the present invention having inductive elements in an ellipsoidal turn in a plan view.
Figure 5:
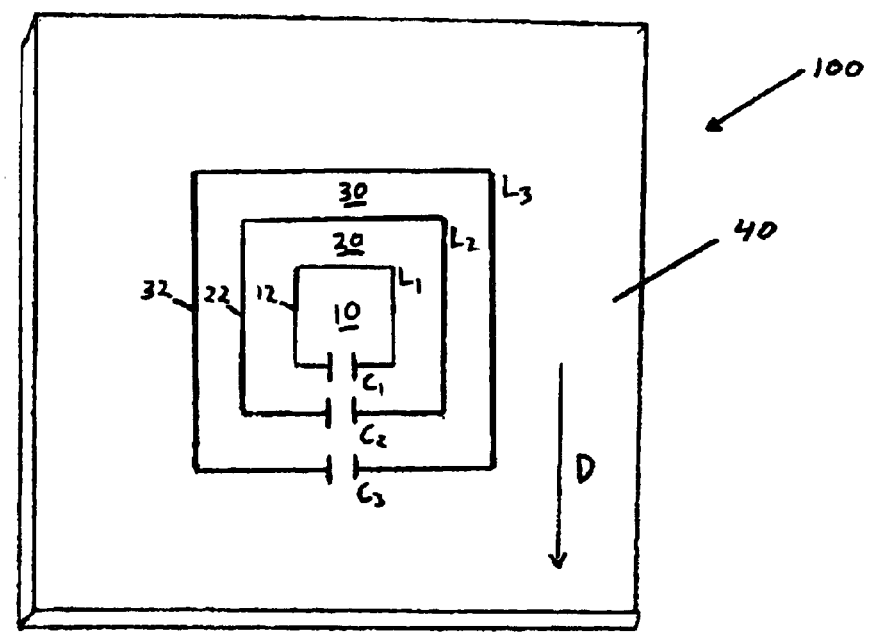
FIG. 5 shows an embodiment of a circuit arrangement according to the present invention inductive elements in a square turn in a plan view.
Figure 6:
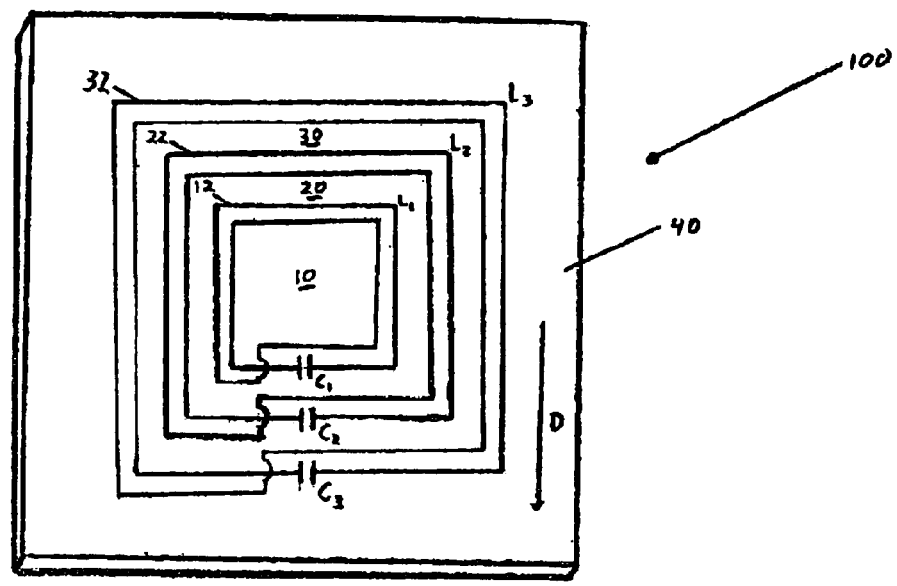
FIG. 6 shows an embodiment of a circuit arrangement according to the present invention having inductive elements in a plurality of square turns in a schematic view.
Figure 7:
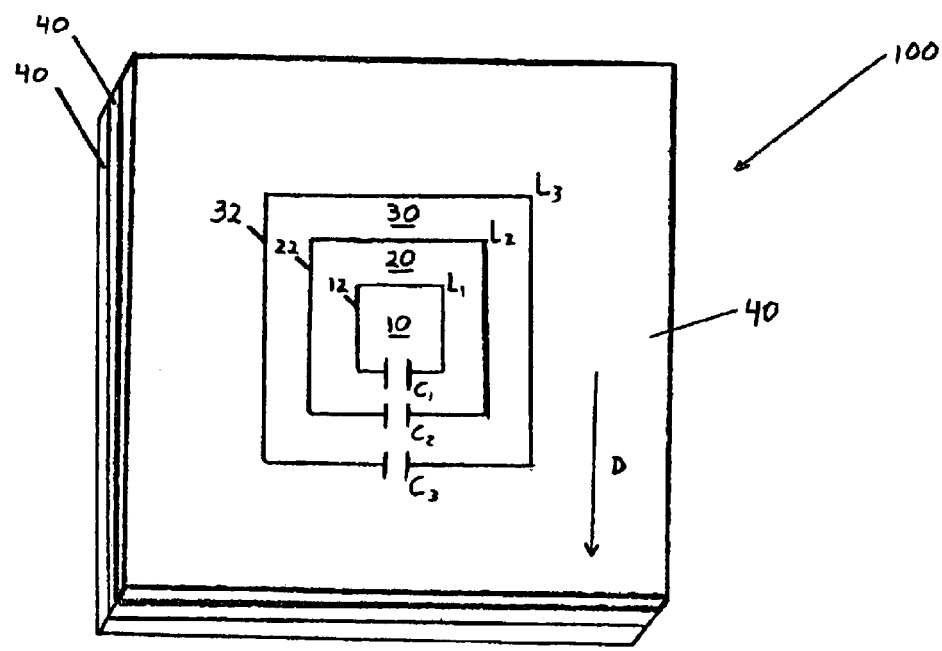
FIG. 7 shows an embodiment of a circuit arrangement according to the present invention inductive elements in a square turn with a plurality of metallization plates in a plan view.

In other embodiments of circuit arrangement 100, three electric resonant circuits 10, 20, 30 can have inductive elements 12, 22, 32 in various forms. These forms include, but are not limited to, the following: Circuit arrangement 100 implemented with inductive elements 12, 22, 32 in the form of a single, essentially oval turn, shown in FIG. 3; Circuit arrangement 100 implemented with inductive elements 12, 22, 32 in the form of a single, essentially ellipsoidal turn, shown in FIG. 4; Circuit arrangement 100 implemented with inductive elements 12, 22, 32 in the form of a single, essentially square turn, shown in FIG. 5. In yet other embodiments, inductive elements 12, 22, 32 can each have a plurality of turns. FIG. 6 shows circuit arrangement 100 implemented with inductive elements 12, 22, 32 in the form of plural square turns. Inductive elements 12, 22, 33 can also be in the form of plural turns in other shapes, including but not limited to circular, rectangular, oval and ellipsoidal. Any of these above embodiments may be used in an integrated circuit made up of multiple circuit arrangements on multiple metallization plates 40. FIG. 7 shows a circuit arrangement 100 implemented with inductive elements 12, 22, 32 in the form of a single, essentially square turn, on a metallization plate 40, which is one of a plurality of metallization plates 40.

List of Reference Signs 100 circuit arrangement
10 (first) circuit
12 (first) inductive element
14 (first) capacitive element
20 (second) circuit
22 (second) inductive element
24 (second) capacitive element 30 (third) circuit
32 (third) inductive element
34 (third) capacitive element
40 metallization plate
C capacitance of a capacitive element
$C_1$ capacitance of the (first) capacitive element 14
$C_2$ capacitance of the (second) capacitive element 24
$C_3$ capacitance of the (third) capacitive element 34
D direction of arranging the capacitive elements 14, 24, 34
$f_r$ resonance frequency
$I_0$ DC current
k coupling factor
L inductance of an inductive element
$L_1$ inductance of the (first) inductive element 12
$L_2$ inductance of the (second) inductive element 22
$L_3$ inductance of the (third) inductive element 32
$R_p$ parallel equivalent resistance
Q quality factor

What is claimed is:

1. A circuit arrangement for filtering and/or selecting single frequencies or frequency ranges of signals, said circuit arrangement (100) comprising at least two electric resonant circuits (10; 20; 30), each resonant circuit comprising
   at least an inductive element (12; 22; 32) and
   at least a capacitive element; having a capacitance other than the parasitic capacitance of remaining portions of the circuit (14; 24; 34) arranged parallel to said at least one inductive element,
characterized in that the resonant circuits (10; 20; 30) are magnetically fixedly coupled to each other, and in that all the resonant circuits (10; 20; 30) of the circuit arrangement (100) are arranged on only one metallization plate (40) of an integrated circuit, having an essentially constant ohmic resistance, said metallization plate being one of plural, and being the one having the least ohmic resistance.

2. A circuit arrangement as claimed in claim 1, characterized in that the inductive elements (12; 22; 32) are magnetically fixedly coupled to each other.

3. A circuit arrangement as claimed in claim 1, characterized in that the individual resonant circuits (10; 20; 30) are essentially arranged in a planar way on an outer surface area of the integrated circuit, and being arranged as concentrically aligned inductors.

4. A circuit arrangement as claimed in 1, characterized in that the geometric structure is a circle, an oval, an ellipse, a square or a rectangle.

5. A circuit arrangement as claimed in claim 1, characterized in that at least two inductive elements (12; 22; 32) which are substantially concentric and/or substantially parallel to each other, said capacitive elements are arranged linearly with respect to each other and number at least three.

6. A circuit arrangement as claimed in claim 5, characterized in that each of the inductive elements (12; 22; 32) comprises one turn.

7. A circuit arrangement as claimed in claim 5, characterized in that each of the inductive elements (12; 22; 32) comprises a plurality of turns.

* * * * *